United States Patent
Vu et al.

(10) Patent No.: US 10,504,595 B1
(45) Date of Patent: Dec. 10, 2019

(54) AMORTIZING DISSIPATED POWER AND CURRENT DEMAND IN A TERNARY CONTENT ADDRESSABLE MEMORY

(71) Applicant: Palo Alto Networks, Santa Clara, CA (US)

(72) Inventors: De Bao Vu, San Jose, CA (US); Matthew Robert Rohm, Los Gatos, CA (US); Subramani Ganesh, San Jose, CA (US); Savitha Raghunath, Cupertino, CA (US); William Alan Roberson, Scotts Valley, CA (US)

(73) Assignee: Palo Alto Networks, Inc., Santa Clara, CA (US)

( * ) Notice: Subject to any disclaimer, the term of this patent is extended or adjusted under 35 U.S.C. 154(b) by 0 days.

(21) Appl. No.: 16/289,617

(22) Filed: Feb. 28, 2019

(51) Int. Cl.
*G06F 12/02* (2006.01)
*G11C 15/00* (2006.01)
*G06F 1/3206* (2019.01)
*G06F 16/903* (2019.01)

(52) U.S. Cl.
CPC ............ *G11C 15/00* (2013.01); *G06F 1/3206* (2013.01); *G06F 16/90339* (2019.01)

(58) Field of Classification Search
CPC .. G11C 15/00; G06F 16/90339; G06F 1/3206
USPC ....................................................... 365/49.1
See application file for complete search history.

(56) References Cited

U.S. PATENT DOCUMENTS

| 8,169,808 | B2 * | 5/2012 | Roohparvar | ......... G11C 15/046 365/49.1 |
| 10,191,839 | B2 * | 1/2019 | Miki | .................... G06F 12/0215 |
| 2009/0190404 | A1 * | 7/2009 | Roohparvar | ......... G11C 15/046 365/185.17 |
| 2018/0018257 | A1 * | 1/2018 | Miki | .................... G06F 12/0215 |

OTHER PUBLICATIONS

Agrawal, "Ternary CAM Power and Delay Model: Extensions and Uses", IEEE Transactions on Very Large Scale Integration (VLSI) Systems, vol. 16, No. 5, May 2008, 11 pgs.
Akhbarizadeh, et al., "A TCAM-Based Parallel Architecture for High-Speed Packet Forwarding", IEEE Transaction on Computers, vol. 56, No. 1, Jan. 2007, 15 pgs.
Bosshart, et al., "Forwarding Metamorphosis: Fast Programmable Match-Action Processing in Hardware for SDN", ACM, Aug. 2013, 12 pgs, retrieved on Jan. 2, 2019 from http://yuba.stanford.edu/~grg/docs/sdn-chip-sigcomm-2013.pdf.

\* cited by examiner

*Primary Examiner* — Xiaochun L Chen
(74) *Attorney, Agent, or Firm* — Gilliam IP PLLC

(57) ABSTRACT

To use larger capacity TCAMs while avoiding various packaging and power management issues of TCAMs, pre-processing can be performed on TCAM lookup requests to intelligently pipeline lookup requests according to a defined power budget that is based on TCAM and power supply specifications. Dividing lookup requests based on a power budget smooths the instantaneous current demand and dynamic power demand. This intelligent pre-processing of lookup requests allows lookup requests that satisfy a power budget based threshold to still complete within a single clock cycle while nominally reducing performance for those (Continued)

lookup requests that would not satisfy the power budget based threshold. When a lookup request will not satisfy the power budget based threshold, the lookup request is split into searches targeting different memory blocks of the TCAM.

20 Claims, 12 Drawing Sheets

US 10,504,595 B1

AMORTIZING DISSIPATED POWER AND CURRENT DEMAND IN A TERNARY CONTENT ADDRESSABLE MEMORY

BACKGROUND

The disclosure generally relates to the field of digital processing systems, and more particularly to memory.

Network devices use ternary content addressable memory (TCAM) for packet processing tasks that rely on fast memory lookups, such as lookups in an access control list or route matching. Similar to a binary content addressable memory (BCAM), a TCAM allows for a fast (single clock cycle) search with a key or tag. The TCAM compares the tag to all words or entries of the TCAM. In addition to the 0 (match) and 1 (no match) states of a BCAM, the TCAM allows a third state referred to as the "don't care" or wildcard state. Packet processing leverages this wildcard state of the TCAM for partial matching of addresses and/or routes. A wildcard search may be local (i.e., one or more table entries has a bit set to be the wildcard) or global (i.e., a wildcard bit is set in the search key).

BRIEF DESCRIPTION OF THE DRAWINGS

Embodiments of the disclosure may be better understood by referencing the accompanying drawings.

DESCRIPTION

The description that follows includes example systems, methods, techniques, and program flows that embody aspects of the disclosure. However, it is understood that this disclosure may be practiced without these specific details. For instance, this disclosure refers to the 8 least significant bits of data values being designated for match estimation. Embodiments can designate a different number of bits and/or a different part of data values to be used for match estimation. This can be chosen based on the type of data value (e.g., network address) and design/configuration choice related to degree of accuracy versus resource consumption for storing larger match estimation patterns. In other instances, well-known instruction instances, protocols, structures and techniques have not been shown in detail in order not to obfuscate the description.

Overview

With greater demands on network devices to handle larger volumes of data traffic at increasing speeds, larger capacity TCAMs are being created to meet those demands. This increases an already large footprint and an already high dynamic power consumption, which in turn has a corresponding greater power dissipation. The dynamic power consumption by the TCAM creates large voltage swings. In addition to fast ramp rates and high dynamic currents causing wear on the power supply, the corresponding power dissipation exacerbates secondary packaging issues related to thermal management. Although precharging the match lines for a lookup is the primary contributor to high dynamic power consumption and instantaneous current demand, a larger TCAM has a greater number of search lines to drive for a lookup.

To use the larger capacity TCAMs while avoiding these issues, pre-processing can be performed on TCAM lookup requests to intelligently pipeline lookup requests according to a defined power budget that is based on TCAM and power supply specifications. Dividing lookup requests based on a power budget smooths the instantaneous current demand and dynamic power demand. This intelligent pre-processing of lookup requests allows lookup requests that satisfy a power budget based threshold to still complete within a single clock cycle while nominally reducing performance for those lookup requests that would not satisfy the power budget based threshold. When a lookup request will not satisfy the power budget based threshold, the lookup request is split into searches targeting different memory blocks of the TCAM. Thus, each of the resulting searches charges fewer search lines and draws power for a portion of the TCAM memory blocks instead of all of the TCAM memory blocks in a single cycle.

Example Illustrations of TCAM with Adaptive Lookup Splitting

Figure 1:
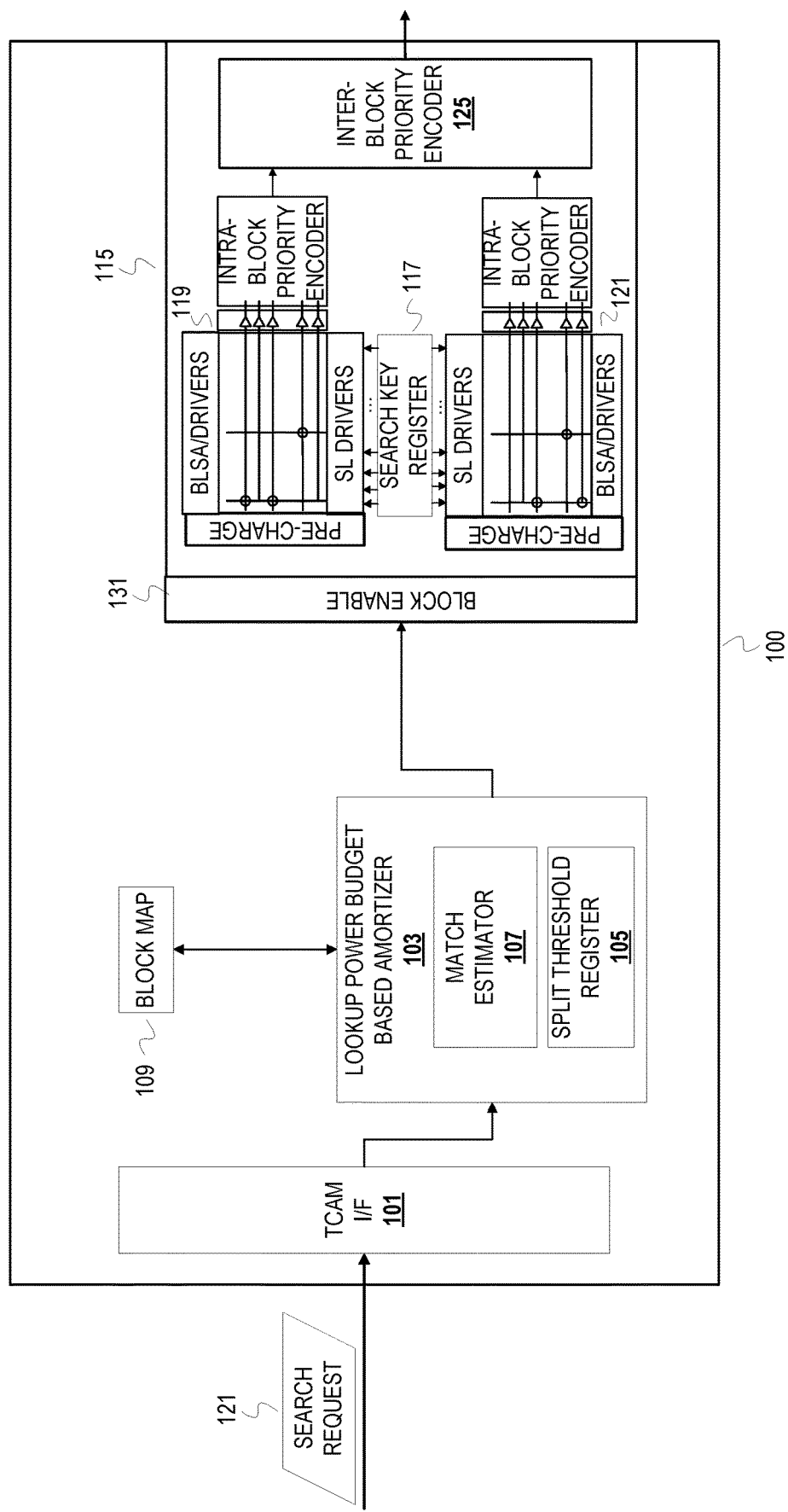
FIG. 1 is a block diagram of a TCAM with additional logic for tuning instantaneous current demand and dynamic power consumption for a lookup request.

FIG. 1 is a block diagram of a TCAM with additional logic for tuning instantaneous current demand and dynamic power consumption for a lookup request. The additional logic tunes instantaneous current demand and dynamic power consumption by performing a lookup that exceeds a threshold defined based on a power budget on different sets of memory blocks of the TCAM over time instead of a lookup in parallel across all memory blocks of the TCAM. This amortizes the current demand and dynamic power consumption across multiple clock cycles, thus reducing the voltage swing and allowing the TCAM to perform lookups at a lower ramp rate.

FIG. 1 depicts a TCAM 100 that includes logic blocks and macro-level architectural components. FIG. 1 limits the depiction of the TCAM 100 to blocks corresponding to the splitting of lookup requests for power consumption and current demand amortization. The TCAM 100 includes a TCAM interface 101, a block map 109, ternary storage 115, and a lookup power budget based amortizer 103. The TCAM interface 101 accepts READ, WRITE, and LOOKUP or SEARCH requests from an external requestor and forwards along an appropriate path in the TCAM 100. The block map 109 indicates memory block to logical table mappings. A TCAM will often host multiple logical tables (e.g., an access control list, routing tables of different communication layers, etc.). A request will specify which logical table(s) is being targeted. The TCAM 100 accesses the block map 109 to determine the appropriate memory blocks to access. The ternary storage 115 includes memory blocks or arrays of cells and peripheral circuitry to perform requests. The periphery circuitry can include bit line sense amplifiers and drivers, search line drivers, matchline pre-charge circuitry, and matchline sense amplifiers. The TCAM 100 is depicted with only memory blocks 119, 121. Each of the memory blocks also includes (or is associated with) an intra-block priority encoder. The ternary storage 115 also includes an inter-block priority encoder 125 to merge the outputs of the intra-block priority encoders. When lookups are performed in parallel across memory blocks of the ternary storage 115, the inter-block priority encoder 125 selects from the intra-block priority encoders of the memory blocks 117, 119. For lookups split for amortization, the outputs of the intra-block priority encoders of the memory blocks 117, 119 are synchronized before being merged (i.e., selected based on priority). Embodiments can add a command input to the intra-block priority encoders to receive a command signal from the lookup power budget based amortizer 103 to indicate when and which outputs are to be buffered to allow for synchronization with other outputs before transmission to the inter-block priority encoder 125. Embodiments can instead add a command input to the inter-block priority encoder to receive a command signal from the amortizer 103 to indicate that a lookup has been split over x clock cycles and to select based on priority after elapse of the x clocks cycles to allow for receipt of the outputs. For simplicity, the TCAM 100 is depicted with a single search key register 117 that connects to the search line (SL) drivers of the different memory blocks 119, 121. Embodiments can input the search/lookup key to the memory blocks of ternary storage differently depending upon the TCAM architecture. The ternary storage 115 also includes block enable circuitry to activate or enable particular memory blocks upon which a request is to be performed.

The lookup power budget based amortizer 103 has visibility of at least the lookup requests received by the TCAM 100. The lookup power budget based amortizer 111 (hereinafter "amortizer") can snoop the lines that carry requests from the TCAM interface 101. When the amortizer 103 detects a lookup request, the amortizer 103 uses a match estimator 107. The match estimator 107 estimates a number of entries in the ternary storage 115 that will match the lookup key of the lookup request. This estimate is based on a part of a lookup key designated for the match estimate. For instance, the 8 least significant bits of a lookup key can be designated or specified for match estimation. The amortizer 103 then compares the match estimate to a split threshold configured in a register 105. If the match estimate exceeds the split threshold, then the amortizer 103 performs the lookup of the lookup key in each of the memory blocks 119, 121 at different times. For instance, the amortizer 103 will communicate a command to the ternary storage 115 that enables memory block 119 and performs the lookup for the lookup key in memory block 119. After communicating the command that performs the lookup in memory block 119, the amortizer 103 submits a command to perform the lookup in block 121—this assumes that the logical table identified in the received lookup request maps to block memory blocks 119, 121. Instead of precharging the matchline in parallel for both memory blocks 119, 121 and then driving the search lines in parallel for both memory blocks 119, 121, the TCAM 100 places a demand on a power supply for individually searching the memory blocks 119, 121.

Configuration of the split threshold is based on TCAM architecture, power supply of the system using the TCAM, and performance requirements for the system. The number and size of memory blocks in the TCAM along with performance requirements for the system can bound the degree of split possible. For example, a TCAM with 127 memory blocks and a requirement that a lookup take a maximum of 4 clock cycles would limit the degree of block split for a lookup request to 32 blocks per clock cycle—assuming the TCAM can enable memory blocks at that granularity. If these parameters allow for a lookup request to be performed as 4 lookups on 4 different sets of memory blocks as a maximum degree of split, specification of the TCAM and host system would be used to set the split threshold. The amount of current to drive search lines in a memory block and the power supply capacity of the system along with reliability based limits per lookup (e.g., a maximum voltage for a lookup) can be used to calculate the split thresholds. Continuing with the maximum of 1 lookup request split into 4 lookups, each step in split (i.e., 1 to 2 lookups, 1 to 3 lookups, 1 to 4 lookups), can be associated with a threshold number of match estimates based on a calculated estimate of current demand to drive the search lines for that number of estimated matches.

Figure 2:
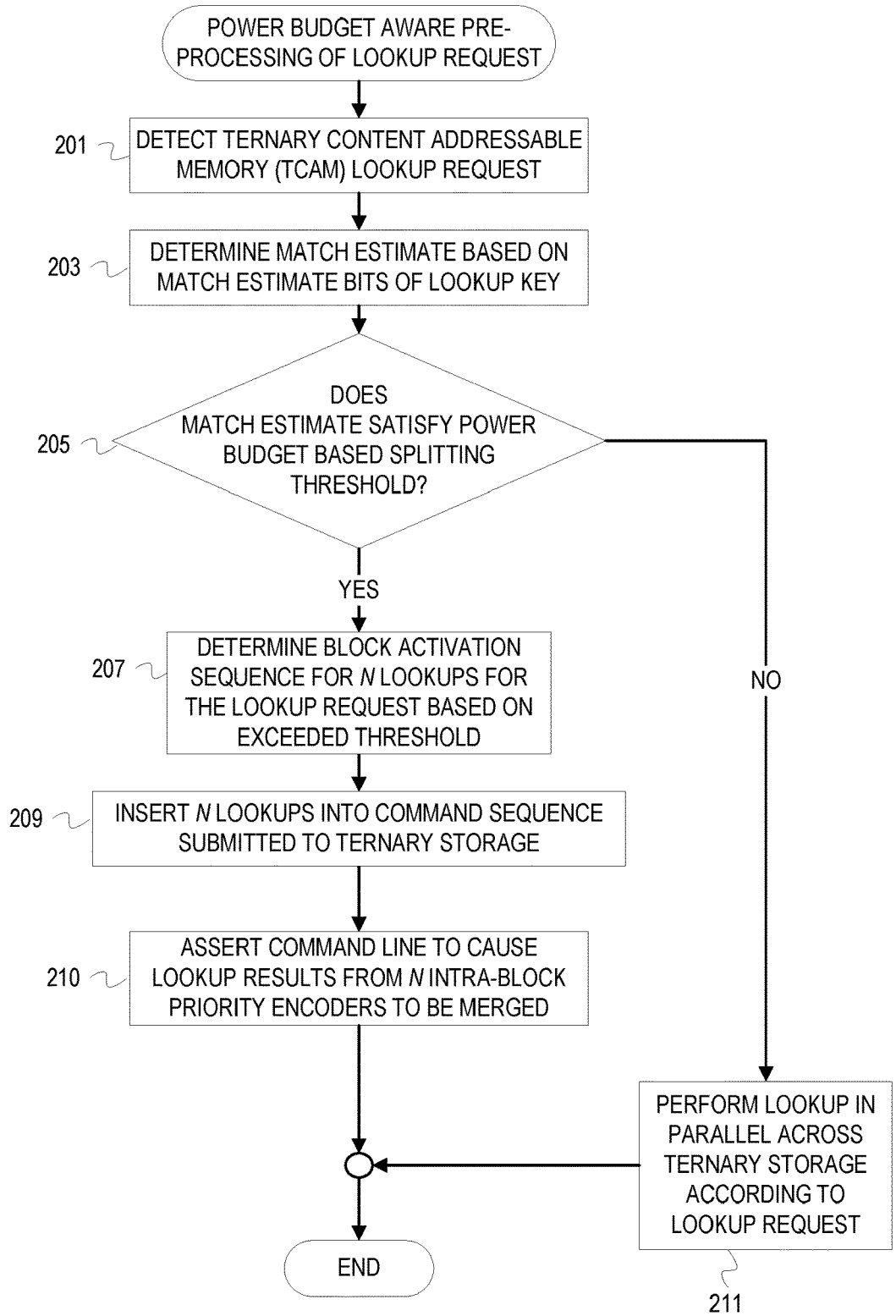
FIG. 2 is a flowchart of example operations for power budget aware pre-processing of a lookup request for a TCAM.

While FIG. 1 provided a general block diagram for the amortizing TCAM, FIG. 2 is a flowchart of example operations for power budget aware pre-processing of a lookup request for a TCAM. FIG. 2 refers to an amortizer as performing the operations for consistency with FIG. 1. The pre-processing is performed to determine whether or not to split a lookup request into multiple lookups across different memory blocks of ternary storage in a TCAM. The moniker "amortizer" can replaced with another moniker for logic in the TCAM that will evaluate a lookup request to determine whether to split the lookup request. For instance, this logic and/or program code may be in a TCAM controller.

At block 201, an amortizer of a TCAM detects a lookup request. The different types of requests sent to a TCAM can encode a request type identifier. In some implementations, the TCAM will have a different input for lookup requests than other inputs. The receive message block can detect the lookup request based on which input path has been used.

At block 203, the amortizer determines a match estimate based on the match estimate bits of the lookup key. The amortizer estimates the number of entries that will match the lookup key based on the designated part of the lookup key for match estimation. As data has been written into the TCAM and removed or overwritten, bookkeeping data has been updated to count the occurrences of various data/bit patterns in the designated bits. This partial key match is the basis for the estimate of TCAM entries that will match the lookup key.

At block 205, the amortizer determines whether the match estimate satisfies the power budget based splitting threshold. If the match estimate satisfies the splitting threshold, then control continues to block 207. If the match estimate does not satisfy the splitting threshold, then control continues to block 211. Satisfying a threshold can be exceeding or equaling the threshold.

At block 207, the amortizer determines a block activation sequence for n lookups that the lookup request is split into. Depending upon the degree of splitting (n) defined for the splitting threshold that was exceeded, the amortizer determines different sets of memory blocks to activate in each of the lookups that will be performed in sequence to carry out the detected lookup request. If the amortizer is to activate 64 blocks in each of 2 lookups for the lookup request, the amortizer will determine the block identifiers to submit to the ternary storage in each lookup command.

At block 209, the amortizer inserts the n lookups into a command sequence to the ternary storage with each command either associated with or indicating a different set of memory blocks to enable. This effectively inserts the lookup commands into n stages of a pipeline to the ternary storage.

At block 210, the amortizer asserts a command line to cause results of the split lookup to be merged together. The TCAM can be designed to merge the results of the split lookup. The merging of split lookup results selects based on priority across the clock cycles sufficient to complete the n lookups.

If the split threshold was not satisfied, then the lookup request is carried out conventionally in parallel across the ternary storage according to the lookup request at block 211.

Figure 3:
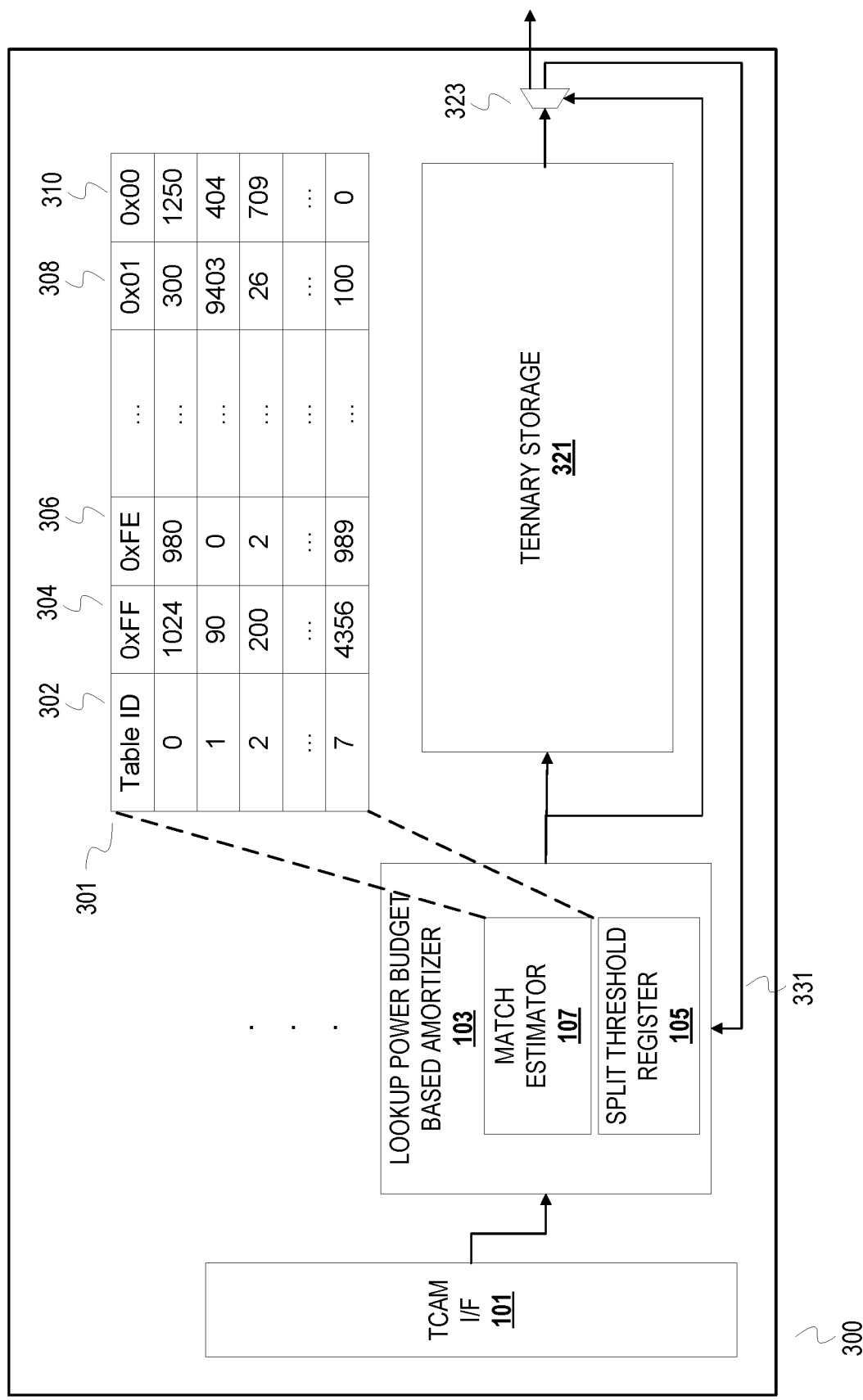
FIGS. 3-4 correspond to embodiments that maintain estimate pattern counts on the TCAM.
Figure 4:
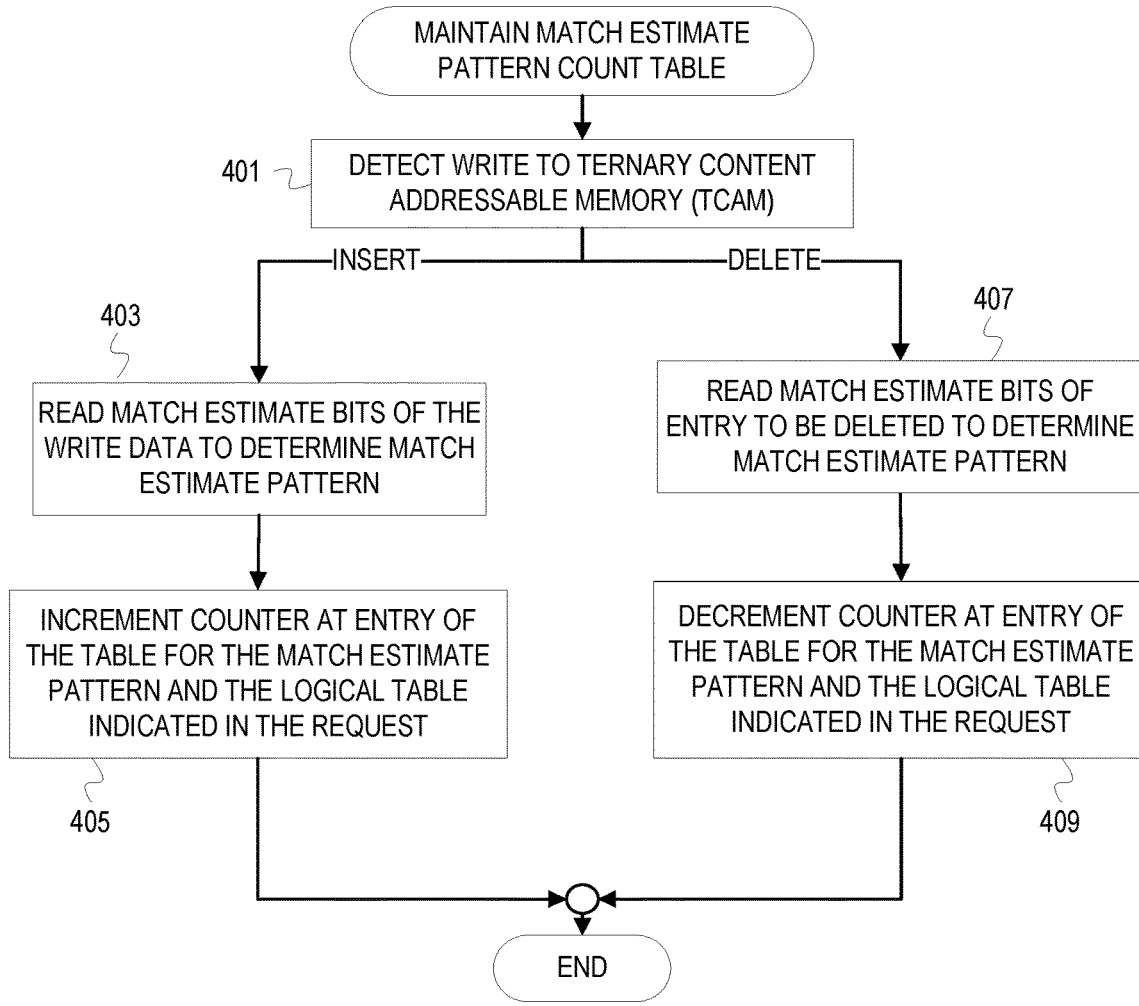
Figure 5:
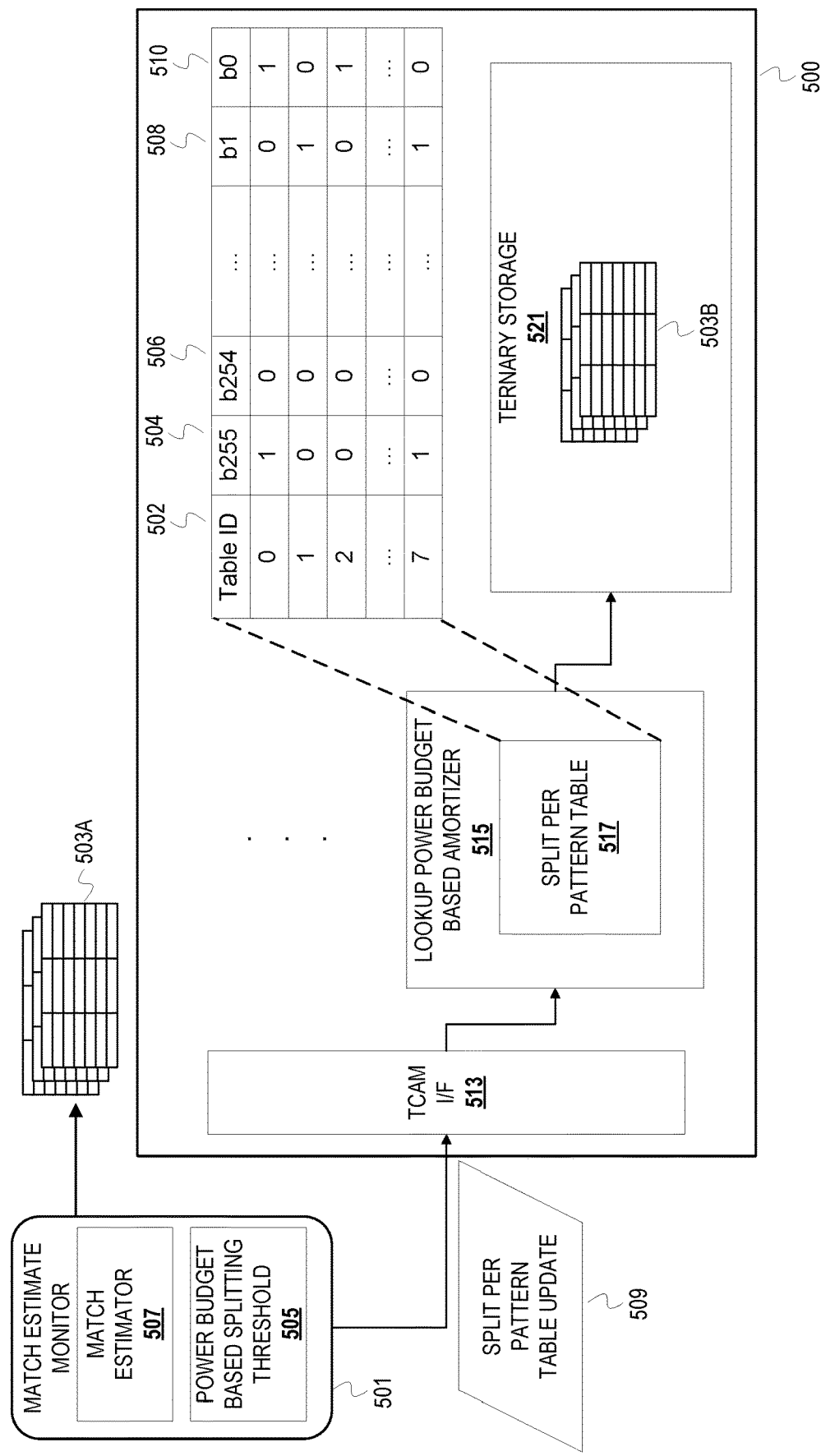
FIGS. 5-6 correspond to embodiments that maintain the estimate pattern counts externally from the TCAM but maintain a split per pattern table on the TCAM.
Figure 6:
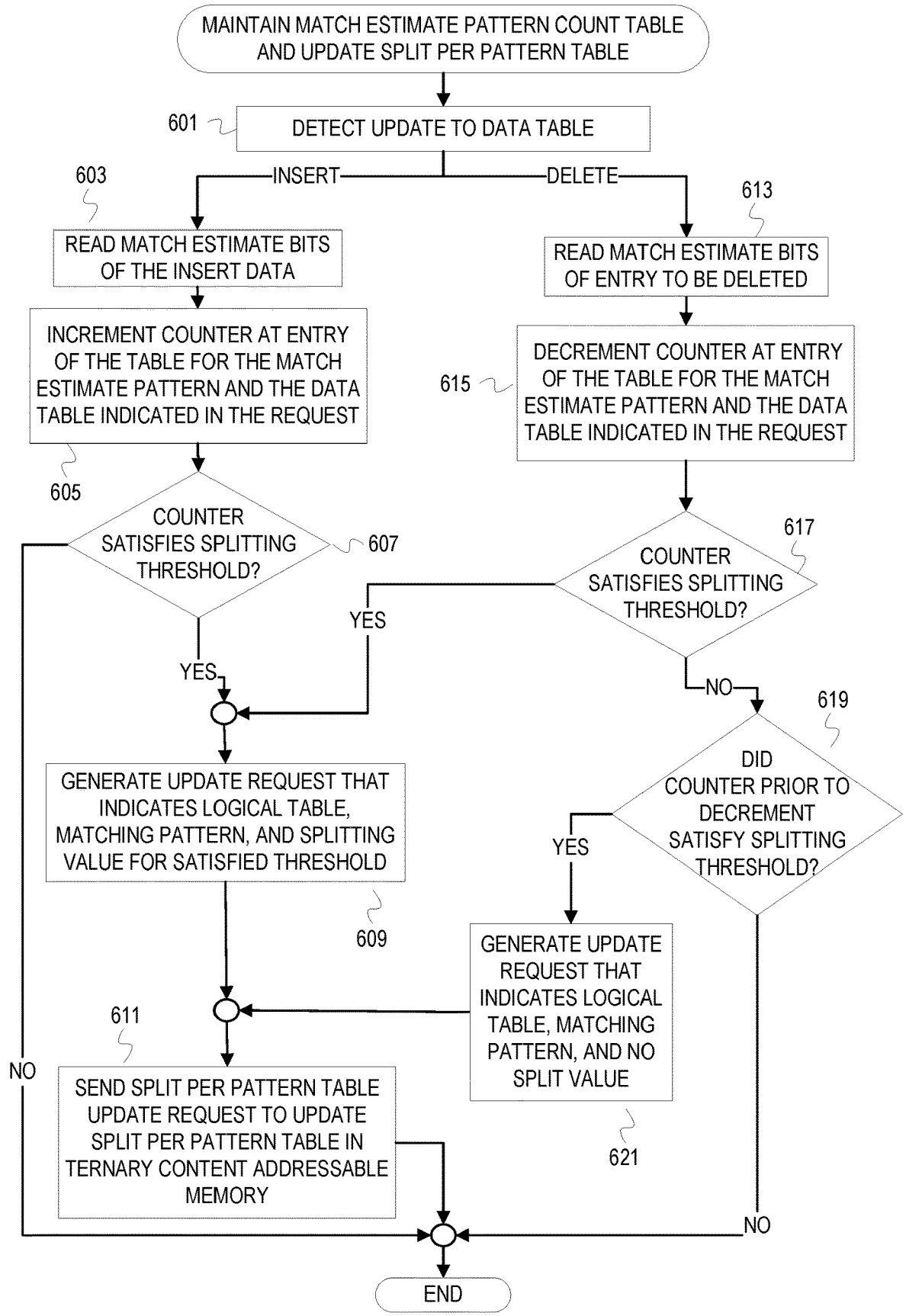
Figure 7:
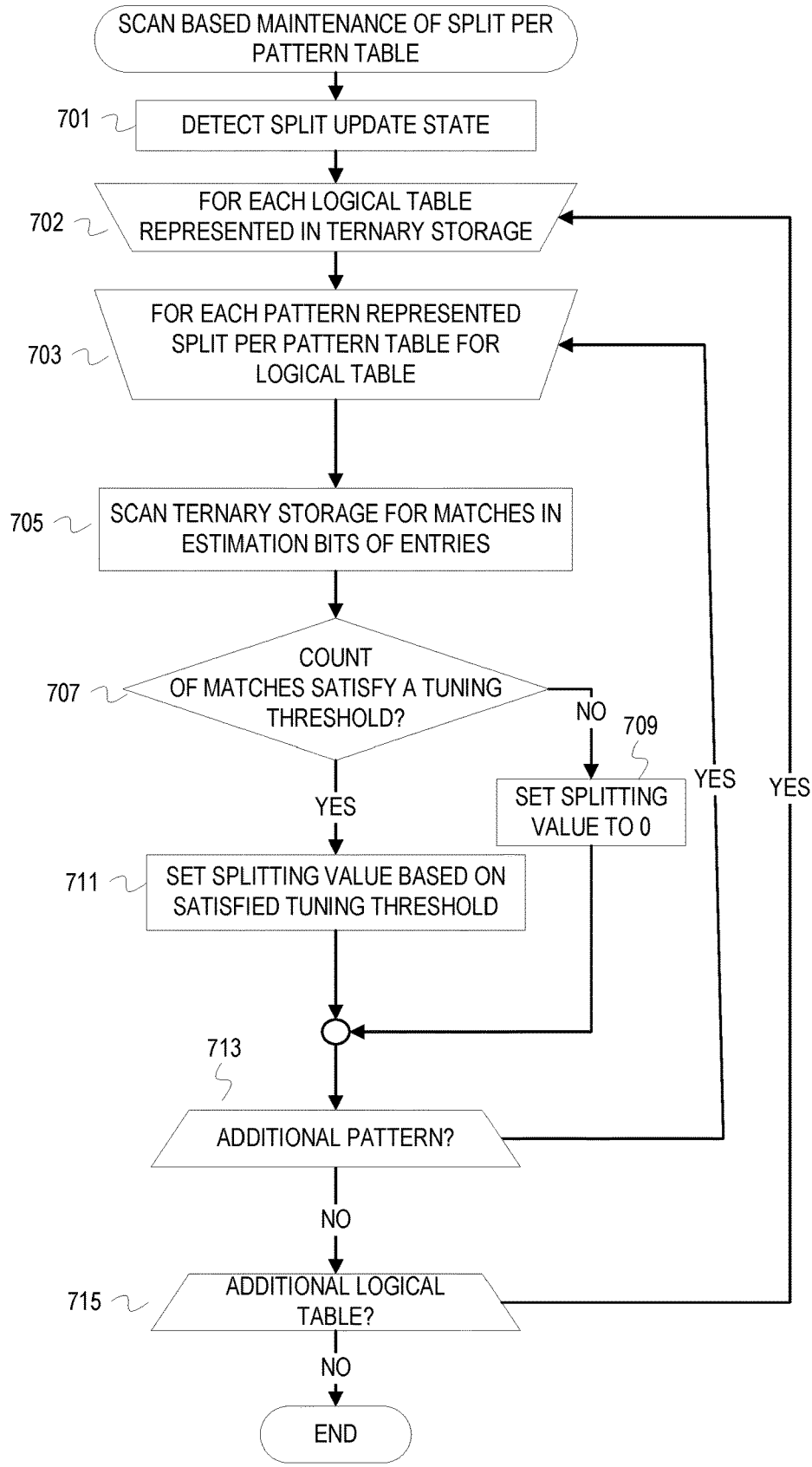
FIG. 7 corresponds to embodiments that use a hardware scanner to determine estimate pattern counts and update a split per pattern table on the TCAM.
Figure 8:
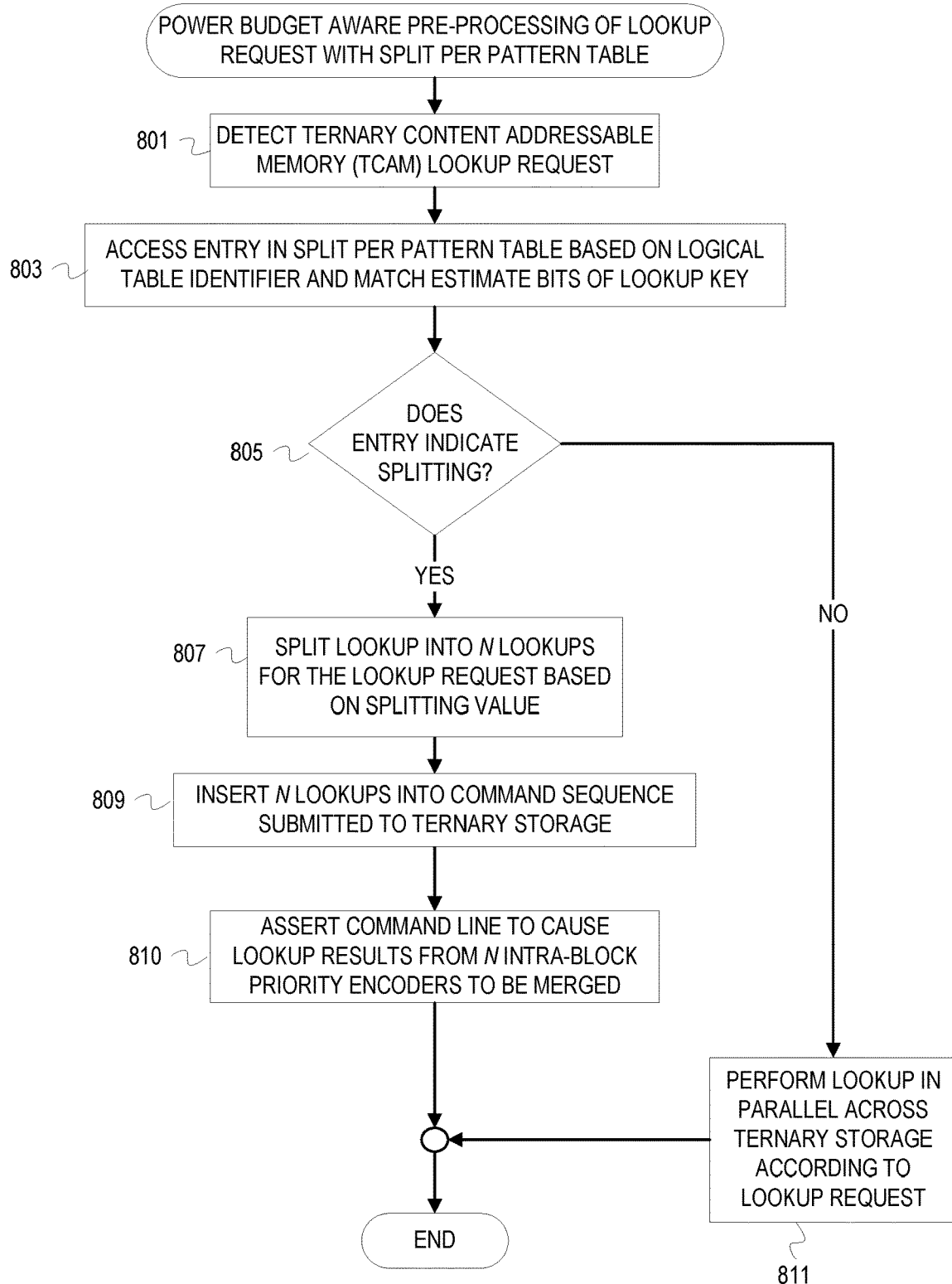
FIG. 8 corresponds to embodiments that use a split per pattern table to evaluate lookup requests.
Figure 9:
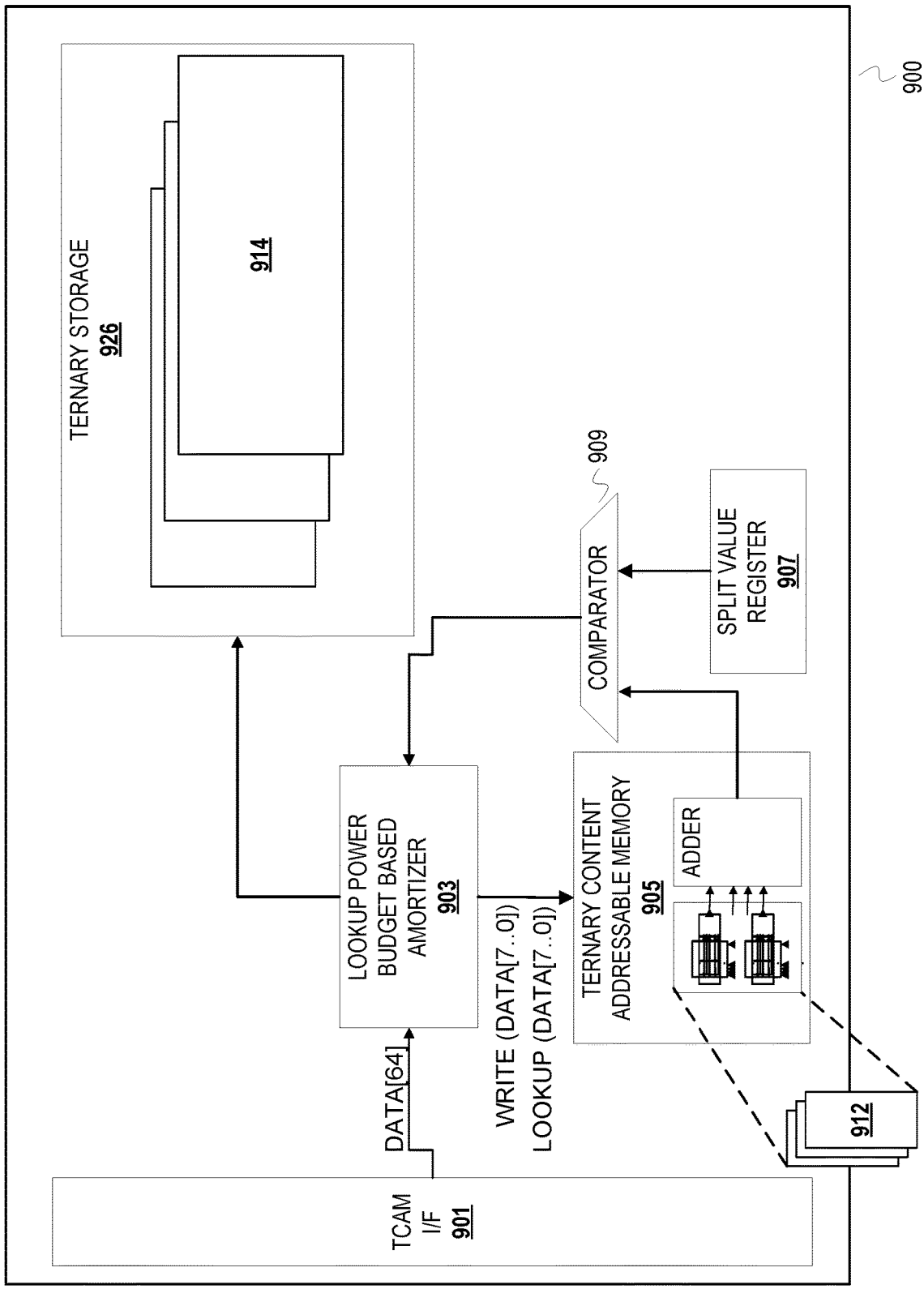
FIGS. 9-10 correspond to embodiments that use a secondary, smaller TCAM within the primary TCAM for maintaining the match estimate part of data written into the primary TCAM.
Figure 10:
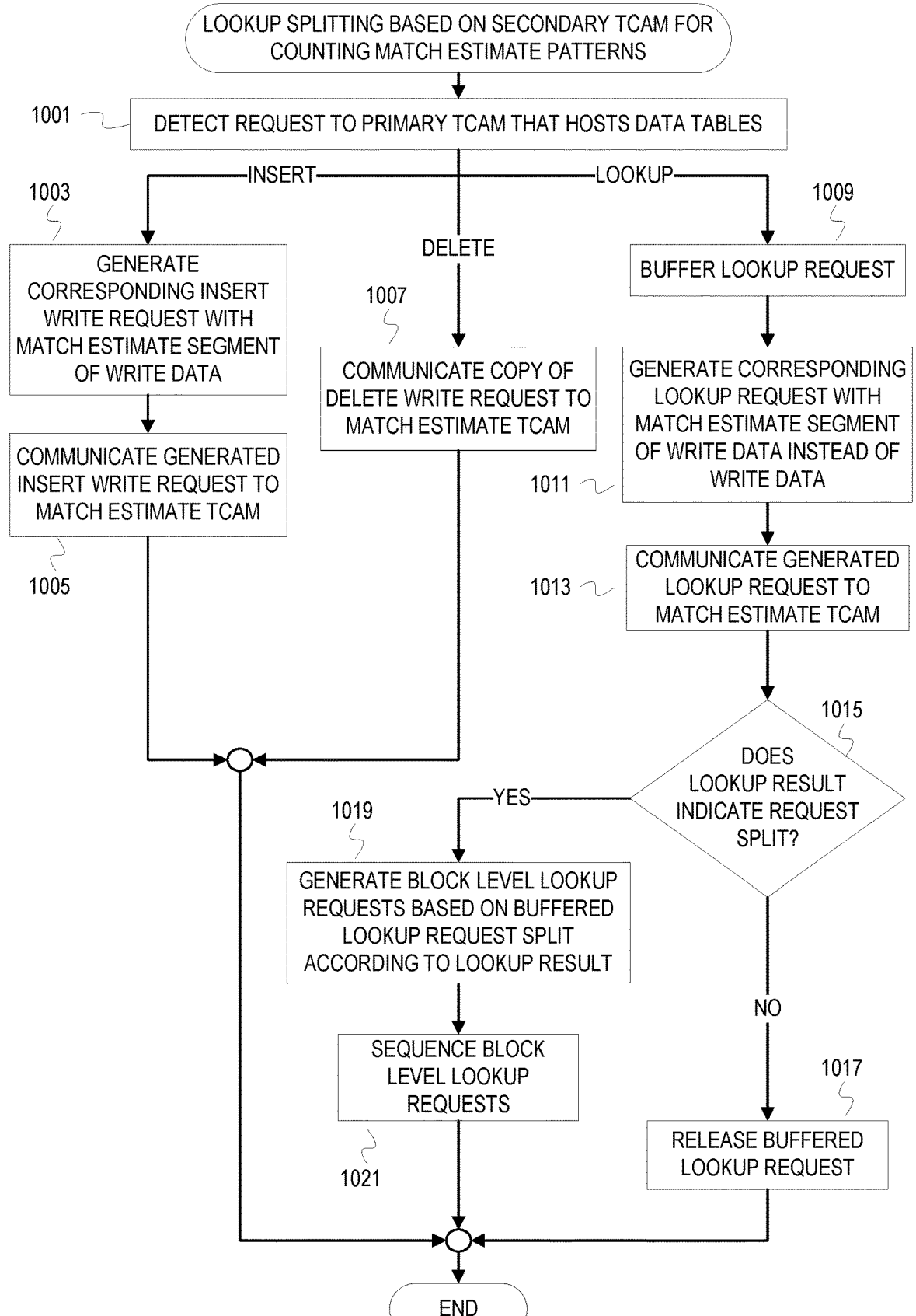

Embodiments can implement the above described amortizer and match estimation differently. FIGS. 3-4 correspond to embodiments that maintain estimate pattern counts on the TCAM. FIGS. 5-6 correspond to embodiments that maintain the estimate pattern counts externally from the TCAM but maintain a split per pattern table on the TCAM. FIG. 7 corresponds to embodiments that use a hardware scanner to determine estimate pattern counts and update a split per pattern table on the TCAM. FIG. 8 corresponds to embodiments that use a split per pattern table to evaluate lookup requests. FIGS. 9-10 correspond to embodiments that use a secondary, smaller TCAM within the primary TCAM for maintaining the match estimate part of data written into the primary TCAM.

FIG. 3 is an example block diagram of a TCAM that maintains a match estimate pattern count on the TCAM. FIG. 3 depicts a TCAM 300 that is similar to the TCAM 100 from FIG. 1. The TCAM 300 is illustrated with a ternary storage 321 and a match estimate pattern count table 301. The ternary storage 321 is similar to the ternary storage 115 in FIG. 1, but has a data path 331 that returns to the amortizer 103.

As in FIG. 1, the amortizer 103 includes a match estimator 107 and a split threshold register 105. However, the amortizer 103 in FIG. 3 maintains the match estimate pattern count table 301 based on received write requests detected from the TCAM interface 101. For writes that insert data, the amortizer 103 determines which pattern occurs in the match estimate part of the data to be inserted and updates a corresponding count in the match estimate pattern count table 301. Likewise, the amortizer 103 decrements count for a match estimate pattern for data values deleted from the ternary storage 321. To determine the pattern occurring in the match estimate bits of the data being deleted, the amortizer 103 submits to the ternary storage 321 a read of the address indicated in the delete type write request.

The TCAM 300 includes circuitry to select the data path 331 instead of an output data path from the ternary storage 321 to an external consumer. FIG. 3 depicts a selecting element 323 (e.g., switch or demultiplexer) that selects an output path for data read from the ternary storage. The selecting element 323 defaults to selecting the output path that provides data to an external destination with respect to the TCAM 300. A control input from the amortizer 103 causes the selecting element 323 to select the data path 331 when the amortizer 103 submits a read to the ternary storage 321. The control input can be sent at a clock cycle corresponding to when the result of the read will be output to the selecting element 323 (e.g., x pulses after the read is communicated to the ternary storage 321). Embodiments can use different implementations to provide data being deleted from a TCAM to a search/lookup amortizer to allow the amortizer to update the match estimate pattern count accordingly (e.g., the selection circuitry can be external to the TCAM).

The example match estimate pattern count table 301 in FIG. 3 includes a row for each logical table in the TCAM 300 and column per match estimate pattern. A first column 302 indicates logical table identifiers. A lookup request will indicate the logical table identifier. Remaining columns 304, 306, 308, and 310 each represent a different possible pattern (depicted in hexadecimal representation) of the 8 least significant bits (8 LSBs) in a data value written into the TCAM 300. This part of the data values (i.e., the 8 LSBs) have been selected to use for match estimation. In the column 304, the counts for the pattern 0xFF for the logical tables 0, 1, 2, and 7 that should currently be in the TCAM 300 are 1024, 90, 200, and 4356, respectively. In the column 306, the counts for the pattern 0xFE for the logical tables 0, 1, 2, and 7 that should currently be in the TCAM 300 are 980, 0, 2, and 989, respectively. In the column 308, the counts for the pattern 0x01 for the logical tables 0, 1, 2, and 7 that should currently be in the TCAM 300 are 300, 9403, 26, and 100, respectively. In the column 310, the counts for the pattern 0x00 for the logical tables 0, 1, 2, and 7 that should currently be in the TCAM 300 are 1250, 404, 709, and 0, respectively. Assuming a split threshold has been set at 5000 for a 1 to 2 split of a lookup request, the amortizer 103 will split a lookup request on table 1 for a lookup key that includes the pattern 0x01 in the 8 LSBs.

FIG. 4 is a flowchart of example operations for maintaining a match estimate pattern count table based on detected write requests to a TCAM. The example operations refer to an amortizer as performing the example operations for consistency with earlier Figures.

At block 401, the amortizer detects a write to the TCAM. Both an insert and a delete may be communicated as write requests, with the delete being an overwrite to a specified address. If the write implements an insert of a data value into the TCAM, then the amortizer reads the 8 LSBs of the data value ("match estimate bits") to be written to determine the match estimate pattern at block 403. The pattern can also be considered/referred to as a value of the match estimate bits or match estimate part of the data value. The amortizer then accesses the table based on the logical table identifier indicated in the write request and the determined match estimate pattern at block 405. The amortizer then increments the counter for the logical table and match estimate pattern at the located table entry also at block 405.

For a delete write request ("delete request"), the amortizer reads the match estimate bits of a data value to be deleted at block 407. The amortizer initially submits a read of an address indicated in the delete request. When the data value at the indicated address are returned from ternary storage to the amortizer, the amortizer reads the match estimate bits to determine the match estimate pattern. The amortizer then accesses the match estimate pattern count table based on the logical table identifier indicated in the delete request and the determined match estimate pattern at block 409. The amortizer then the counter for the logical table and match estimate pattern at the located table entry also at block 409.

FIG. 5 is a block diagram of a lookup amortizing TCAM that uses a split per pattern table based on externally maintained match estimate pattern counts. Data tables (e.g., access control lists and routing tables) stored within a TCAM will be stored in other storage/memory accessible to software that accesses the data tables. The data tables external to the TCAM can be leveraged for counting occurrences of match estimate patterns in data values. In FIG. 5, data tables 503A in a memory or storage external to a TCAM 500 should be the same as data tables 503B stored in ternary storage 521 of the TCAM 500. These data tables 503A, 503B "should" be the same, but difference can arise due to latency in updating, errors, etc.

An instance of program code identified as a match estimate monitor 501 includes program code for a match estimator 507 and maintains a power budget based splitting threshold 505. The splitting threshold 505 can be configured via an interface or configuration file of the match estimate monitor 501. The match estimator 507 maintains counts of occurrences of match estimate patterns in data values written to the data tables 503A. The match estimator 507 can snoop update requests to the data tables 503A to update match estimate pattern counts per logical table or can periodically scan the data tables 503A to count match estimate pattern occurrences per table. If the match estimator 507 maintains the counts of match estimate pattern occurrences based on snooped/detected update requests to the data tables 503A, then the match estimator 507 can evaluate one or more changed counts against the splitting threshold 505 when or proximate to detection of the count change. If the match estimator 507 periodically or in response to a scan condition/trigger (e.g., manual request, detection of a threshold number of updates, etc.) scans the data tables 503A, then the match estimator 507 may evaluate counts against the splitting threshold 505 while or after scanning the data tables 503A.

Based upon detecting that a match estimate pattern for a logical table(s) satisfies the splitting threshold 505, the match estimate monitor 501 sends an update request 509 to the TCAM 500. The update request 509 encodes a value indicating that the update request 509 is a request to update a split per pattern table 517 maintained by a lookup power budget amortizer 515. A TCAM interface 513 reads the update request 509 and communicates the update request 509 to the amortizer 515 up determining it is an update request for the split per pattern table 517. The example split per pattern table 517 includes a row for each logical table stored (or to be stored) in the TCAM 500. A first column 502 indicates table identifiers. Remaining columns of the split per pattern table 517 correspond to the different match estimate patterns that are possible. Again, assuming that 8 bits (least or most significant bits) have been specified for match estimation in data values, the split per pattern table 517 includes 256 columns for the 256 different possible match estimate patterns. The columns can be considered bit maps for the match estimate patterns. Each column (after the table identifier column) corresponds to a bit in a bit map that maps to the match estimate patterns. Thus, the match estimate monitor 501 is configured to arrange or organize the match estimate pattern occurrence counts according to the bit mapping presumed by the split per pattern table 517. A subset of those columns are depicted as columns 504, 506, 508, 510. The columns 504, 506, 508, 510 represent four different match estimate patterns. Since occurrence counts are maintained external, the split per pattern table 517 indicates whether or not a lookup is to be split into multiple lookups. In this example, a single bit is used to indicate whether or not to split a lookup request. The split per pattern table 517 indicates that a lookup request with the match estimate pattern mapping to bit 255 should be split for logical tables identified as 0 and 7. For the match estimate pattern that maps to bit 0, the split per pattern table 517 indicates that a lookup request indicating logical table 0 or 2 should be split to comply with power budget.

FIG. 6 is a flowchart of example operations for maintaining a match estimate pattern count table and corresponding split per pattern table. FIG. 6 refers to a match estimate monitor performing the example operations to be consistent with FIG. 5, although program code naming can be arbitrary. The operations depicted with blocks 601, 603, 605, 607, 609 are similar to the operations depicted in blocks 401, 403, 405, 407, 409 of FIG. 4.

At block 601, the match estimate monitor detects an update to data tables maintained external to a TCAM but corresponding to data tables in the TCAM. If the update is an insert to a data table, then the match estimate monitor reads the match estimate bits to be written to determine the match estimate pattern at block 603. The match estimate monitor then accesses the match estimate pattern count table based on the table identifier indicated in the update request and the determined match estimate pattern at block 605. The match estimate monitor then increments the counter for the data table and the match estimate pattern at the located match estimate pattern count table entry also at block 605.

At block 607, the match estimate monitor determines whether the incremented count satisfies a splitting threshold. Depending upon configuration, there can be multiple splitting thresholds if there a lookup request can be split into more than 2 lookups. For instance, the split values or split states in the split per pattern table 517 of FIG. 5 can have 2 bits per entry to indicate one of up to 4 possible split states/values: 00 for no split, 01 for 1 to 2 split, 10 for 1 to 3 split, and 11 for 1 to 4 split. Each split state would be associated with a different split threshold. If no split threshold is satisfied by the incremented counter, then the process ends.

If a split threshold is satisfied by the incremented counter, then the match estimate monitor generates an update request with the corresponding split value at block 609. The update request indicates the logical table identifier corresponding to the updated data table and the match estimate pattern column or bit location depending on whether the split values are single bit or multi-bit. The match estimate monitor then communicates the update request for the split per pattern table to the TCAM at block 611.

For a delete update to a data table, the match estimate monitor reads the match estimate bits of the data value to be deleted to determine the match estimate pattern at block 613. The match estimate monitor then, at block 615, accesses the match estimate pattern count table based on the table identifier indicated in the delete request and the determined match estimate pattern. The match estimate monitor then decrements the counter for the data table and the match estimate pattern at the located match estimate pattern count table entry, also at block 615.

At block 617, the match estimate monitor determines whether the decremented counter satisfies a splitting threshold. If the decremented counter satisfies a splitting threshold, then control flows to block 609. It can be the case that the decremented counter now satisfied a splitting threshold corresponding to a split value of 01 instead of 10. If the decremented counter does not satisfy a splitting threshold, the match estimate monitor performs additional operations to determine whether decrementing the counter transitioned the split value to a non-split state.

At block 619, the match estimate monitor determines whether the counter prior to decrementing satisfies a splitting threshold. The match estimate monitor can store the counter to a temporary variable before decrementing and then use the pre-decrement counter value to evaluate against the splitting threshold(s). If the pre-decrement counter did not satisfy a splitting threshold, then the process ends. If the pre-decrement counter satisfied a splitting threshold, then control flows to block 621.

At block 621, the match estimate monitor generates an update request to set a split state for the corresponding logical table and match estimate pattern of the data value being deleted to a no split state. The match estimate monitor generates the request with indications of the logical table and the bit location or mapped position of the match estimate pattern. Control flows from block 621 to block 611.

The use of a split per pattern table may add less circuitry to a conventional TCAM than maintaining the counts of pattern occurrences on a TCAM. However, some additional communication overhead is incurred since the counts are maintained externally. Embodiments can use a hardware scanner in the TCAM to count occurrences of values/patterns in the designated bits of data values for match estimation. Embodiments could use the existing scanner circuitry that is part of the error and redundancy circuitry. The hardware scanning can perform lookups for each match estimation pattern in ternary storage. Additional circuitry can add the hits in ternary storage to obtain a count of entries that have a match estimate pattern. FIG. 7 is a flowchart of operations for maintaining a split per pattern table for logical tables in a TCAM based on hardware scans of the TCAM entries. The description of FIG. 7 refers to an amortizer as performing the example operations.

At block 701, the amortizer detects a split update state. The split update state is an event or indication that the amortizer is to run a hardware scanner to count occurrences of match estimate patterns in ternary storage of a TCAM. This can be a periodic scan.

At block 702, the amortizer begins traversing the identifiers of the logical tables represented in the ternary storage. For instance, the amortizer traverses a table map that maps logical tables to memory blocks of ternary storage. At block 703, the activated hardware scanner circuitry begins scanning for match estimation patterns in the match estimation bits of entries in ternary storage of the TCAM for the currently selected logical table. The hardware scanner can scan a register of the match estimation patterns. For each match estimation pattern, the hardware scanner scans across the entries to count the number of entries that match the currently selected match estimation pattern. At block 707, the amortizer determines whether the count satisfies a splitting threshold. If the count does not satisfy the splitting threshold, then the amortizer sets the splitting value for that match estimation pattern for the currently selected logical table to indicate no split (e.g., 0 or 00) at block 709. If the count satisfies the splitting threshold, then the amortizer sets the splitting value for that match estimation pattern for the currently selected logical table at block 711.

The amortizer iterates through the logical table identifiers and match estimation patterns. At block 713, the amortizer determines whether there is another match estimation pattern to scan for within the ternary storage. If there is another match estimation pattern to scan for, control returns to block 703. If not, then control flows to block 715 at which the amortizer selects the next logical table identifier. If there is not another logical table identifier, then the process ends. Otherwise, control returns to block 702.

Performing a lookup in TCAM that utilizes the split per pattern table and performing a lookup in a TCAM that maintains counts of occurrences of match estimation patterns are similar. However, embodiments that use a split per pattern table remove the determination of whether a split threshold has been satisfied from the lookup path. FIG. 8 is a flowchart of example operations for power budget aware pre-processing of a lookup request for a TCAM using a split per pattern table. FIG. 8 refers to an amortizer as performing the operations for consistency with the other examples.

At block 801, an amortizer of a TCAM detects a lookup request. The different types of requests sent to a TCAM can encode a request type identifier. In some implementations, the TCAM will have a different input path for lookup requests than other inputs. The amortizer can detect the lookup request based on which input path has been used.

At block 803, the amortizer accesses a split per pattern table to determine whether or not the lookup request should be split. The split per pattern table can be implemented as a register with sufficient entries form logical tables and p match estimate patterns. The value p is $2^b$, with b being the number of bits specified for match estimate patterns. The value m can be a configurable parameter of the TCAM. Each entry in the register is sufficient to hold a split value, which depends on the number of splits allowed. If a single split is allowed, then each entry holds a bit. If a lookup can be split into 4 lookups, then each entry can hold 2 bits for the 4 possible split values. The amortizer accesses the split per pattern table with an identifier of a logical table indicated in the lookup request and the pattern or value in the designated match estimate bits of the lookup key.

At block 805, the amortizer determines whether the split value at the accessed entry in the split pattern table indicates that the detected lookup request should be split. If the split value is a no split value (e.g., 0), then control flows to block 811. At block 811, the TCAM performs the lookup in parallel across the memory blocks of ternary storage. If the split value indicates a split, then control flows to block 807.

At block 807, the amortizer splits the lookup into the N lookups depending upon the split value read from the accessed table entry. For example, a split value of '10' may indicate that the lookup is to be split into 3 lookups. The amortizer would determine three different sets of memory blocks to search which correspond to the logical table identifier indicated in the lookup request.

At block 809, the amortizer inserts the n lookups into a command sequence to the ternary storage with each command either associated with or indicating a different set of memory blocks to enable. This effectively inserts the lookup commands into n stages of a pipeline to the ternary storage.

At block 810, the amortizer asserts a command line to cause results of the split lookup to be merged together. The TCAM can be designed to merge the results of the split lookup. The merging of split lookup results selects based on priority across the clock cycles sufficient to complete the n lookups.

Another technique for determining whether to split a lookup request uses a secondary, smaller TCAM within a primary TCAM. FIG. 9 is a block diagram of an example TCAM that uses a smaller, internal TCAM for hosting match estimate patterns. A TCAM ("primary TCAM") 900 includes a secondary TCAM 905 and ternary storage 926. The secondary TCAM 905 mirrors the match estimate portion of data values stored into the ternary storage 926. FIG. 9 depicts the TCAM 905 as hosting data tables 912, which are a portion of the data tables 914 in the ternary storage 926.

When an amortizer 903 of the TCAM 900 receives a request from a TCAM interface 901, the amortizer 903 duplicates the requests to the secondary TCAM 905. However, the amortizer 903 extracts the match estimate bits from the data value of the received request. Assuming a data value is 64 bits and the TCAM 900 has been configured to treat the 8 LSBs as the match estimate bits, the amortizer 903 will extract bits 0 to 7 from selected requests and replace the 64 bit data value to be searched or written with an 8 bit data value from bits 0 to 7. The amortizer selects for duplication lookup requests, delete write requests, and insert write requests. These requests will be processed by the TCAM 905.

However, additional circuitry/logic is added to determine whether a lookup should be split. Instead of a priority encoder, the TCAM 905 includes an adder to add the number of hits in ternary storage of the secondary TCAM 905 for a lookup key. This sum is communicated to a comparator 909. The comparator 909 will read a split value from a split value register 907 that has been written (e.g., via an application programming interface or user interface) into the register 907. The comparator 909 compares the sum of hits from the TCAM 905 and the split value. If the TCAM 900 is designed or configured to making a binary split decision (i.e., split a lookup into 2 lookups or do not split), then the comparator 909 will output a do not split or split indication to the amortizer 903. If the TCAM 900 is designed or configured for multiple levels of lookup splitting, then the comparator can output the sum to the amortizer 903. The amortizer 903 can determine the extent of splitting based on the sum.

FIG. 10 is a flowchart of example operations for lookup splitting based using a secondary TCAM for counting occurrences of match estimate patterns in a primary TCAM. The example operations refer to an amortizer as performing the operations for consistency with the rest of the description. The example operations are likely performed by firmware loaded into a TCAM controller.

At block 1001, an amortizer detects a request for the primary TCAM. Since writes and lookups are duplicated to the secondary TCAM, read requests are not considered. The amortizer would allow the read request to flow through to ternary storage or the path for read requests would not cross the amortizer within the primary TCAM.

If the request is an insert write request, then at block 1003 the amortizer generates a corresponding insert write request with a match estimate segment of the data being written. The generated insert write request will have the same logical table identifier as the received insert write request. At block 1005, the amortizer communicates the generated insert write request to the secondary TCAM or match estimate TCAM. After processing by the secondary TCAM, the secondary TCAM will have a data value entry that corresponds (the match estimate bits) to a data value entry in ternary storage of the primary TCAM.

If the request is a delete write request, then at block 1007 the amortizer generates a corresponding delete write request. Unlike the insert write request, the delete write request can be a copy or duplicate of the received delete write request since the delete write request indicates an address or entry to overwrite and not a data value to insert.

If the request is a lookup request, then the amortizer buffers the lookup request at block 1009 for a number of cycles sufficient for a corresponding lookup request to be performed on the secondary TCAM and a comparator to generate a split indicator output. At block 1011, the amortizer generates a corresponding lookup request based on the received lookup request. Similar to an insert write request, the amortizer will extract the match estimate bits of the lookup key so that the generated lookup request is a lookup for the match estimate segment of the lookup key and not the entire lookup key. At block 1013, the amortizer communicates the generated lookup request to the secondary TCAM.

After communicating the generated lookup request to the secondary TCAM, the amortizer will receive a lookup result from the comparator as described earlier. At block 1015, the amortizer determines whether the lookup result from the comparator indicates a split. If it does not indicate a split, then at block 1017 the buffered lookup request is released to be performed on the ternary storage of the primary TCAM. If the lookup result from the comparator indicates a split, then at block 1019 the amortizer generates multiple lookup requests that target different sets of memory blocks in ternary storage of the primary TCAM. The multiple requests effectively splits the requested lookup into multiple lookups to amortize the dynamic power demand. The amortizer will generate the lookup requests based on the lookup result from the comparator (i.e., number of lookups based on split indicator). At block 1021, the amortizer sequences the multiple lookups to ternary storage of the primary TCAM.

Example Illustrations of Dynamic Prioritization of TCAM Memory Blocks

The above example illustrations describe splitting a lookup into multiple lookups across different sets of memory blocks. Instead of a lookup in parallel across the memory blocks of ternary storage, different sets of memory blocks are enabled in sequence and the lookup is performed on the enabled/activated memory blocks. Embodiments can select the memory blocks in each set based on priority. Assuming a ternary storage has 1026 memory blocks that can be searched in parallel. Each of the memory blocks will be associated with an address or block identifier within the TCAM. Lower addresses can have higher priority than higher addresses. With a 1:3 split of a lookup, embodiments can generate the lookup requests to search blocks 0-341 in parallel, then blocks 342-683 in parallel, and finally blocks 684-1025 in parallel. However, embodiments may allow for dynamic reallocation of memory blocks and dynamic prioritization of memory blocks in a TCAM.

With conventional TCAM devices, data structures or tables are allocated contiguous memory blocks. To resize a table, contiguous memory blocks are reallocated to satisfy the resizing request. As an example, a routing table with Internet Protocol (IP) version 4 addresses may have unused entries while a routing table with IP version 6 addresses needs additional entries. Dynamic block assignment of memory blocks to logical tables allows for allocation of discontinuous memory blocks, memory block reassignment, and changing prioritization of memory blocks. With dynamic memory block assignment and dynamic prioritization, resizing could be done without disrupting traffic processing. For this, a TCAM has been designed to maintain a register of priority assignments to memory blocks ("block priority register") and a block allocation map that maps logical table identifiers to memory blocks.

Figure 11:
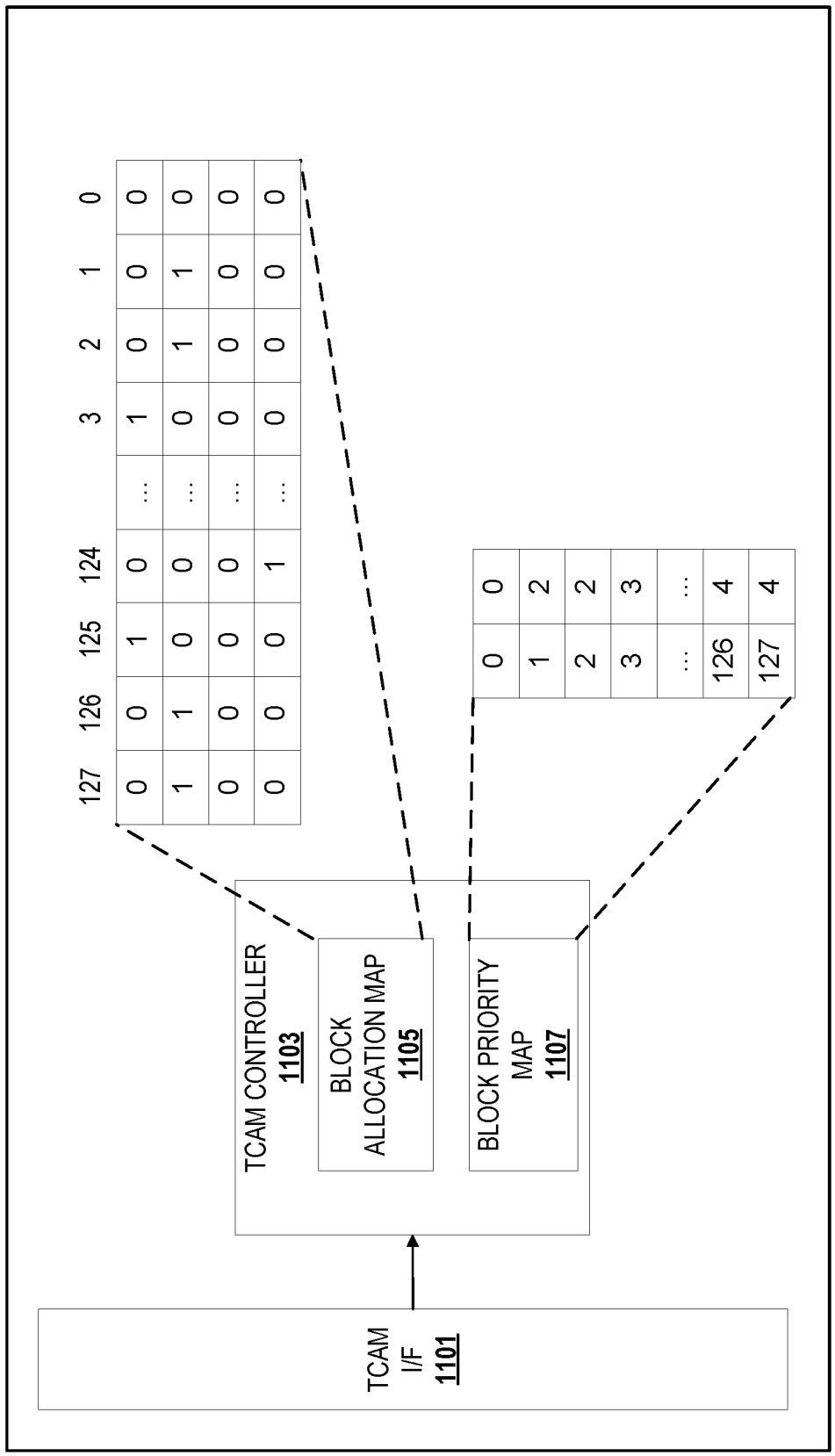
FIG. 11 is a block diagram of a TCAM configured for dynamic block assignment and prioritization.

FIG. 11 is a block diagram of a TCAM configured for dynamic block assignment and prioritization. A TCAM 1100 includes a TCAM interface 1101 and a TCAM controller 1103. A TCAM controller could also include the previously described amortizer and a block map, such as the bock map 109 of FIG. 1. Other components, such as ternary storage, have not been depicted to avoid unnecessarily complicating the illustration. The TCAM controller 1103 maintains and uses a block allocation map 1105 and a block priority map 1107. The TCAM controller 1103 maintains these maps 1107, 1107 based on configuration commands (e.g., register write requests) received via the TCAM interface 1101. For example, a resize request may indicate that 50 unused entries from table A should be re-assigned to table B.

The TCAM controller 1103 writes blocks assignments to a register that stores the block allocation map 1105. In the block allocation map 1105, each row represents an entry that corresponds to a different logical table. In this example, each row implicitly identifies a logical table (e.g., the first row corresponds to the first logical table). Embodiments can implement the block allocation map 1105 to explicitly identify logical tables. Within each entry, a bit position corresponds to a memory block. Assuming 128 memory blocks, there would be 128 bits. For block allocation/ assignment, the TCAM controller 1103 will set bit positions to 1. In the illustrated example block allocation map 1105, the rightmost bit position of each entry corresponds to memory block 1 and the leftmost bit position corresponds to memory block 128. A logical table that can be identified with table identifier 0 has at least been allocated memory blocks 125 and 3. A logical table that can be identified with table identified 1 has been allocated memory blocks 127, 126, 2, and 1. Thus, logical tables in the TCAM 1100 have been allocated non-contiguous memory blocks.

The TCAM controller 1103 writes priorities to the block priority map 1107. A command that changes block assignment will have a counterpart priority update command, which can be resetting a priority to 0 for a deallocated memory block or updating to a specified priority. As discussed earlier, a TCAM includes a priority encoder to select a result when a lookup hits multiple entries. Typically, the data is written to the TCAM according to a priority scheme based, at last partly, on wildcard bits. Instead of a static, implied priority, the TCAM controller 1103 writes priorities of memory blocks into the block priority map 1107. Each entry of the block priority map 1107 corresponds to a memory block. Memory block identifiers are illustrated in the first column of block priority map 1107. The second column of the block priority map 1107 indicates the assigned priority value. Block 0 does not have a priority assigned because block 0 has not been allocated to any logical tables as indicated in the illustrated block allocation map 1105.

When the TCAM controller 1103 detects a read or write request, the TCAM controller 1103 accesses the block allocation map 1105 to determine the memory blocks on which to perform the request. For lookup requests, both the block allocation map 1105 and the block priority map 1107 will be used.

Figure 12:
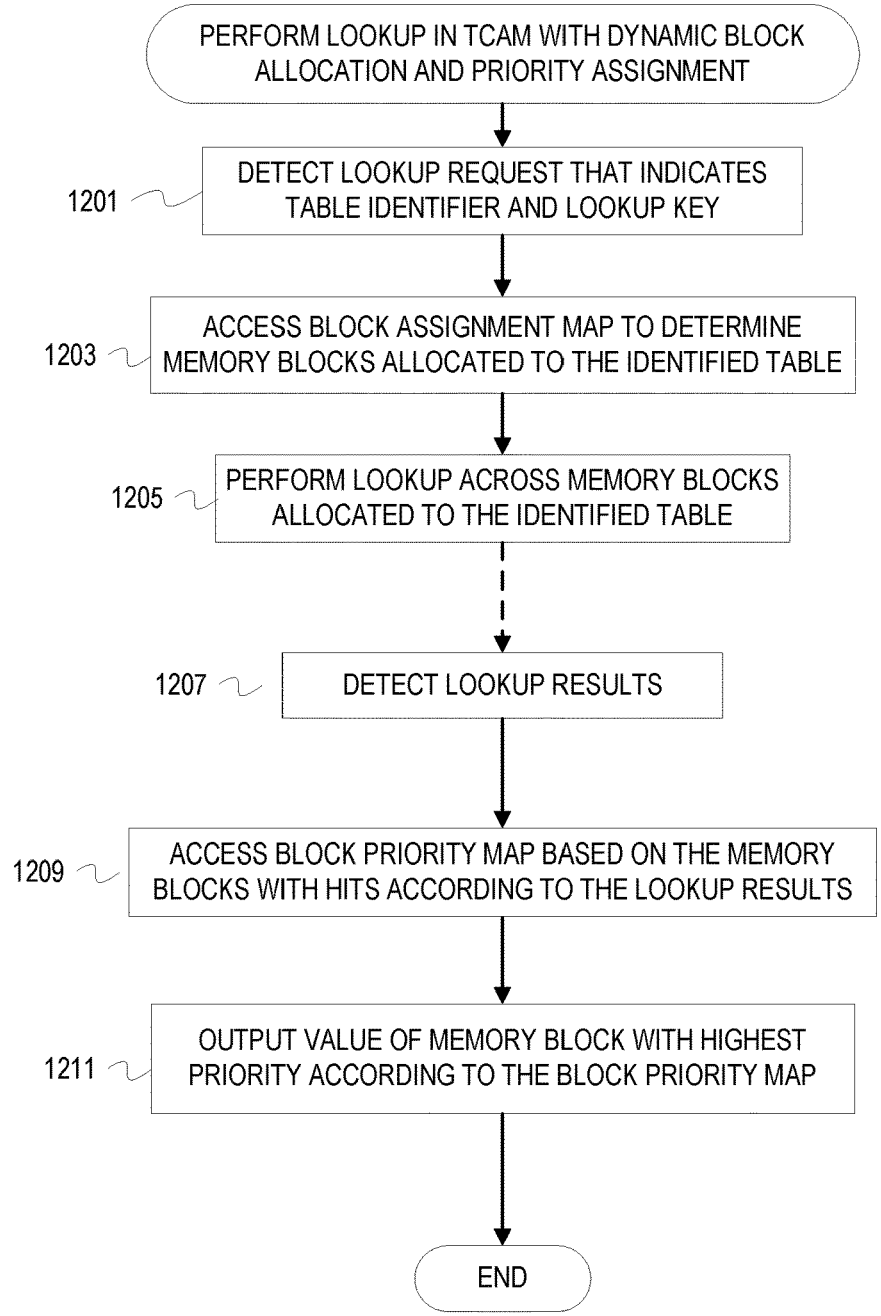
FIG. 12 is a flowchart of example operations for performing a lookup in a TCAM with dynamic memory block allocation and priority assignment.

FIG. 12 is a flowchart of example operations for performing a lookup in a TCAM with dynamic memory block allocation and priority assignment. At block 1201, a TCAM controller detects a lookup request that indicates a table identifier and a lookup key. At block 1203, the TCAM controller accesses a register with the block allocation map to determine the memory blocks allocated to the identified table. At block 1205, the TCAM controller performs the memory lookup in ternary storage on the memory blocks determined to be allocated to the identified table. For instance, the TCAM controllers sends block identifiers for activation to ternary storage circuitry.

At block 1207, a priority encoder detects results of the lookup performed in the ternary storage. At block 1209, the priority encoder accesses a register that hosts the block priority map to determine priorities of the memory blocks indicated in the lookup results as having at least partial matches to the lookup key. Embodiments can design the priority encoder to have access to the block priority map register directly or indirectly via the TCAM controller. At block 1211, the priority encoder determines which of the memory blocks with a hit has highest priority according to the block priority map. The priority encoder then selects for output the value of the memory block determined to have highest priority.

Variations

Embodiments can have a TCAM controller with an amortizer and dynamic block allocation and priority assignment. For lookup splitting, the amortizer would access the block allocation map to determine which memory blocks to search and may access the block priority map to determine how to sequence split lookups. With respect to merging lookup results for a split lookup, a priority encoder may buffer results until all results are received before accessing the block priority map. In other embodiments, a priority encoder can access the block priority map as each set of results is received and store the block identifier with high priority for comparison against the highest priority in the next set of results.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

While the aspects of the disclosure are described with reference to various implementations and exploitations, it will be understood that these aspects are illustrative and that the scope of the claims is not limited to them. In general, techniques for splitting TCAM lookups as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

TERMINOLOGY

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

What is claimed is:

1. A method comprising:
   estimating a number of hits in a first ternary content addressable memory (TCAM) for a lookup key of a lookup request on the first TCAM;
   determining whether the number of hits satisfies a first threshold, wherein the first threshold corresponds to a lookup power budget for the first TCAM;
   based on a determination that the estimated number of hits satisfies the first threshold, splitting the lookup request into a plurality of lookup requests that each targets different sets of one or more memory blocks of the first TCAM; and
   pipelining the plurality of lookup requests to a storage component of the first TCAM, wherein the storage component includes the memory blocks.

2. The method of claim 1, wherein estimating the number of hits in the first TCAM comprises determining a count of a pattern within the lookup key that should be stored within the first TCAM, wherein the pattern is formed from a subset of bits of the lookup key and wherein the estimated number of hits is the count of the pattern that should be within the first TCAM.

3. The method of claim 2 further comprising determining a set of one or more logical tables indicated in the lookup request, wherein determining the count of the pattern comprises determining the count of the pattern that should be stored in the set of one or more logical tables in the first TCAM.

4. The method of claim 2 further comprising the first TCAM maintaining in a register of the first TCAM counts of different patterns per logical table that should be in the storage component of the first TCAM.

5. The method of claim 1 further comprising:
   generating a second lookup request based on the lookup request, wherein the second lookup request comprises a second lookup key that is a subset of the bits of the lookup key;
   submitting the second lookup request to a second TCAM within the first TCAM, wherein the second TCAM hosts subsets of keys within the first TCAM,
   wherein estimating the number of hits in the first TCAM comprises determining a sum of hits in the second TCAM for the second lookup request.

6. The method of claim 1 further comprising:
   updating a first register within the first TCAM based on a determination that the estimated number of hits satisfies the first threshold, wherein the first register hosts split lookup indications for each possible pattern of bits in a specified set of bit positions,
   wherein splitting the lookup request is based on determining that the first register hosts a split lookup indication at an entry corresponding to a pattern occurring in the specified set of bit positions in the lookup key.

7. The method of claim 6 further comprising:
   based on detecting an update to data maintained external to the first TCAM that corresponds to data maintained in the first TCAM, updating a count of a first of the patterns corresponding to the update, wherein the count is maintained external to the first TCAM and the count is the estimated number of hits in the first TCAM for a lookup key that includes the first pattern.

8. The method of claim 1, wherein pipelining the plurality of lookup requests comprises sequencing the plurality of lookup requests across multiple clock cycles of the first TCAM.

9. The method of claim 1, wherein pipelining the plurality of lookup requests comprises:

determining which of the memory blocks to search based, at least in part, on a set of one or more logical tables indicated in the lookup request; and enabling different sets of the determined memory blocks for each of the plurality of lookup requests.

10. The method of claim 1 further comprising synchronizing results of the plurality of lookup requests for priority encoding.

11. A ternary content addressable memory (TCAM) comprising:

ternary storage comprising a plurality of memory blocks and peripheral circuitry for accessing the memory blocks; and a TCAM controller configured to, estimate whether lookup for a key in the ternary storage according to a received lookup request will conform to a power budget for a lookup on the TCAM; and based on a determination that lookup for the key in the ternary storage according to the received lookup request will not conform to a power budget, enable different sets of the plurality of memory blocks over multiple clock cycles and submit the key for lookup to the ternary storage for each enabled set of the plurality of memory blocks.

12. The TCAM of claim 11 further comprising:

a first plurality of priority encoders, each of the first plurality of priority encoders coupled with a different set of the plurality of memory blocks for priority encoding of outputs of the corresponding set of the plurality of memory blocks; and a second priority encoder coupled with the first plurality of priority encoders to priority encode output of the first plurality of priority encoders.

13. The TCAM of claim 12, wherein the second priority encoder is also coupled with the TCAM controller, wherein the TCAM controller is configured to communicate a command to the second priority encoder to synchronize priority encoding of outputs from the first plurality of priority encoders and the second priority encoder is configured to synchronize priority encoding of outputs from the first plurality of encoders corresponding to a search for the key in the different sets of the plurality of memory blocks over multiple clock cycles.

14. The TCAM of claim 12, wherein the first plurality of priority encoders is also coupled with the TCAM controller, wherein the TCAM controller is configured to control the first plurality of priority encoders to synchronize outputs to the second priority encoder corresponding to the search for the key in the different sets of the plurality of memory blocks over multiple clock cycles.

15. The TCAM of claim 11 further comprising:

a first register, wherein the TCAM controller is further configured to maintain in the register counts of a plurality of patterns within values that should be stored in the ternary storage, wherein the plurality of patterns comprises different patterns of bits in a set of designated bit positions of values stored into the TCAM, wherein the TCAM controller being configured to estimate whether lookup for a key in the ternary storage according to a received lookup request will conform to the power budget comprises the TCAM controller being configured to, determine which of the plurality of patterns occurs in the key at the set of designated bit positions, determine the counts of that pattern indicated in the register, and determine whether the counts of that pattern satisfy a threshold that corresponds to the power budget and that has been programmed into the TCAM, wherein a determination that lookup for the key will not conform to the power budget is a determination that the determined counts satisfy the threshold.

16. The TCAM of claim 11 further comprising:

selection circuitry coupled to an output line of the ternary storage;

a first data path from the selection circuitry to the TCAM controller and a second data path from the selection circuitry to supply data to a destination external to the TCAM; and a control line from the TCAM controller to the selection circuitry to control the selection circuitry to select either the first data path or the second data path for data output from the ternary storage, wherein the TCAM controller is configured to control the selection circuitry to select the first data path for a value of an entry to be deleted from the ternary storage and is configured to update the register to reduce a count of the corresponding one of the plurality of patterns that occurs in the value to be deleted at the set of specified bit positions.

17. The TCAM of claim 11 further comprising:

a first register, wherein the TCAM controller is configured to maintain in the first register a table comprising entries for each of a plurality of patterns that can occur in a set of specific locations of values stored into the TCAM and is configured to update the table with split indications for those of the plurality of patterns that occur at the set of specified locations in values that should be stored within the TCAM beyond a programmed threshold, wherein the TCAM controller being configured to estimate whether lookup for the key in the ternary storage according to the received lookup request will conform to the power budget comprises the TCAM controller being configured to access the first register for the one of the plurality of patterns that occurs in the key at the set of specified bit positions to determine whether the corresponding entry indicates split.

18. The TCAM of claim 11 further comprising:

a second, smaller TCAM having an adder coupled with the priority encoders of memory blocks of the second TCAM;

a first register to store a programmed split threshold; and a comparator coupled to receive input from the adder and the first register and coupled to output to the TCAM controller a result of comparing the input from the adder with the input from the first register, wherein the TCAM controller is configured to generate requests from requests received by the TCAM and submit the generated requests to the second TCAM, wherein the requests generated by the TCAM controller have keys or values that are subsets of the keys or values in the received requests.

19. A non-transitory machine-readable medium having stored therein program code comprising instructions to:

maintain, for a first instance of a first data table, counts of occurrences of patterns in a specified part of values in the first instance of the first data table;

evaluate the counts to determine whether a count satisfies a first threshold that corresponds to a lookup power budget for a ternary content addressable memory (TCAM);

based on a determination that a first of the counts satisfies the first threshold, communicate a command to the TCAM to set a splitting value in a register for a first of the patterns corresponding to the first count that satisfies the first threshold, wherein the splitting value indicates a degree of splitting for a lookup request for a lookup key with data in the specified part that matches the first pattern.

20. The non-transitory machine-readable medium of claim 19, wherein the instructions to maintain, for a first instance of a first data table, counts of occurrences of patterns in a specified part of values in the first instance of the first data table comprise instructions to:

based on detection of an insert update to the first instance of the first data table, determine which of the patterns occurs in a value being inserted at the specified part of the value being inserted and increment the one of the counts corresponding to that pattern; and based on detection of a delete update to the first instance of the first data table, determine which of the patterns occurs in a value being deleted at the specified part of the value being deleted and decrement the one of the counts corresponding to that pattern.

* * * * *

UNITED STATES PATENT AND TRADEMARK OFFICE
CERTIFICATE OF CORRECTION

Page 1 of 1

PATENT NO. : 10,504,595 B1
APPLICATION NO. : 16/289617
DATED : December 10, 2019
INVENTOR(S) : De Bao Vu et al.

It is certified that error appears in the above-identified patent and that said Letters Patent is hereby corrected as shown below:

On the Title Page

Item (71) Applicant portion reading "Palo Alto Networks" should read --Palo Alto Networks, Inc.--

Signed and Sealed this
Twenty-fourth Day of November, 2020

Andrei Iancu
*Director of the United States Patent and Trademark Office*